United States Patent
Tak et al.

(10) Patent No.: US 11,252,825 B2
(45) Date of Patent: Feb. 15, 2022

(54) VOICE-ACTIVATED ELECTRONIC DEVICE ASSEMBLY WITH SEPARABLE BASE

(71) Applicant: Google LLC, Mountain View, CA (US)

(72) Inventors: Jung Guen Tak, Millbrae, CA (US); Amy Martin, San Francisco, CA (US); Willard McClellan, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/222,323

(22) Filed: Apr. 5, 2021

(65) Prior Publication Data

US 2021/0227703 A1    Jul. 22, 2021

Related U.S. Application Data

(63) Continuation of application No. 16/653,709, filed on Oct. 15, 2019, now Pat. No. 10,973,134, which is a
(Continued)

(51) Int. Cl.
*H05K 5/00* (2006.01)
*H04R 1/02* (2006.01)
(Continued)

(52) U.S. Cl.
CPC ............. *H05K 5/0004* (2013.01); *H04R 1/02* (2013.01); *H04R 1/24* (2013.01); *H05K 5/0217* (2013.01);
(Continued)

(58) Field of Classification Search
CPC ...... H05K 5/0004; H05K 5/0217; H04R 1/24; H04R 1/028; G10L 15/08; G10L 15/22; G10L 2015/088; G10L 2015/223
(Continued)

(56) References Cited

U.S. PATENT DOCUMENTS 5,444,194 A    8/1995 Reinke
5,659,665 A    8/1997 Whelpley, Jr.
(Continued)

FOREIGN PATENT DOCUMENTS

CN    104038585    9/2014
GB    2480360    11/2011
(Continued)

OTHER PUBLICATIONS

CNBC, "Google Home: A Device That Will Control Your Smart Home | CNBC", last updated May 2016, one page, available at: https://www.youtube.com/watch?v=T_CFajsyDbs.
(Continued)

*Primary Examiner* — Binh B Tran
(74) *Attorney, Agent, or Firm* — Byrne Poh LLP

(57) ABSTRACT

A voice-activated electronic device including a first portion with a first internal surface having a first attachment structure, and a second portion with a second internal surface having a second attachment structure. The first and second internal surfaces have compatible shapes that permit the first and second portions to be moved from a separated position to a joined position, where when the first portion and the second portion are in the joined position the first and second internal surfaces form a nested arrangement. The first and second attachment structures form a secure but separable connection to one another when the first and second portions are in the joined position. The first and second portions are configured to be joined securely and separated through manual human manipulation of one or both of the first portion and the second portion to move the first and second portions between separated and joined positions.

18 Claims, 7 Drawing Sheets

Related U.S. Application Data continuation of application No. 15/717,820, filed on Sep. 27, 2017, now Pat. No. 10,448,520.

(60) Provisional application No. 62/403,681, filed on Oct. 3, 2016, provisional application No. 62/403,685, filed on Oct. 3, 2016.

(51) Int. Cl.
| | | |
|---|---|---|
| *H04R 1/24* | (2006.01) | |
| *H05K 5/02* | (2006.01) | |
| *G10L 15/08* | (2006.01) | |
| *G10L 15/22* | (2006.01) | |

(52) U.S. Cl.
CPC .............. *G10L 15/08* (2013.01); *G10L 15/22* (2013.01); *G10L 2015/088* (2013.01); *G10L 2015/223* (2013.01); *H04R 1/028* (2013.01)

(58) Field of Classification Search
USPC ...................................................... 361/679.01
See application file for complete search history.

(56) References Cited

U.S. PATENT DOCUMENTS

| | | | |
|---|---|---|---|
| 6,397,186 | B1 | 5/2002 | Bush et al. |
| 6,822,466 | B1 | 11/2004 | Holcombe et al. |
| 8,340,975 | B1 | 12/2012 | Rosenberger |
| 9,036,858 | B1 | 5/2015 | Reeves et al. |
| 9,064,356 | B2 | 6/2015 | Salmon et al. |
| 9,554,632 | B2 | 1/2017 | Tarnow et al. |
| 9,648,440 | B2 * | 5/2017 | Crockett ................. H04S 7/307 |
| 9,843,851 | B2 | 12/2017 | Chamberlin et al. |
| 9,967,644 | B2 | 5/2018 | Chawan et al. |
| 9,990,002 | B2 | 6/2018 | Kim |
| 10,149,080 | B2 | 12/2018 | Kim |
| 2008/0266783 | A1 | 10/2008 | Mills et al. |
| 2013/0177195 | A1 | 7/2013 | Sze et al. |
| 2013/0272562 | A1 | 10/2013 | Tzeng |
| 2013/0339850 | A1 | 12/2013 | Hardi et al. |
| 2014/0125271 | A1 | 5/2014 | Wang |
| 2014/0126761 | A1 | 5/2014 | Pham |
| 2014/0148018 | A1 | 5/2014 | Kim |
| 2014/0278435 | A1 | 9/2014 | Ganong et al. |
| 2014/0333449 | A1 | 11/2014 | Thiesfeld et al. |
| 2014/0363988 | A1 | 12/2014 | An |
| 2015/0003629 | A1 | 1/2015 | Killian et al. |
| 2015/0022620 | A1 | 1/2015 | Siminoff |
| 2015/0097666 | A1 | 4/2015 | Boyd et al. |
| 2015/0199566 | A1 | 7/2015 | Moore et al. |
| 2015/0208152 | A1 | 7/2015 | Hanna et al. |
| 2015/0223002 | A1 * | 8/2015 | Mehta ....................... H04S 7/30 381/303 |
| 2015/0333458 | A1 | 11/2015 | Hallsten et al. |
| 2015/0334480 | A1 | 11/2015 | Yang et al. |
| 2016/0040825 | A1 | 2/2016 | Franklin |
| 2016/0064854 | A1 | 3/2016 | Schooley |
| 2017/0300831 | A1 | 10/2017 | Gelfenbeyn et al. |
| 2017/0330429 | A1 | 11/2017 | Tak et al. |
| 2017/0347477 | A1 | 11/2017 | Avital |
| 2018/0004482 | A1 | 1/2018 | Johnston et al. |
| 2018/0187828 | A1 | 7/2018 | Law et al. |

FOREIGN PATENT DOCUMENTS

| | | |
|---|---|---|
| JP | H061821 | 1/1994 |
| JP | 2001151263 | 6/2001 |
| JP | 2003190544 | 7/2003 |
| JP | 2005151237 | 6/2005 |
| JP | 1499786 | 6/2014 |
| JP | 2015171133 | 9/2015 |
| JP | 2016100741 | 5/2016 |
| JP | 2016523395 | 8/2016 |
| KR | 101661191 | 9/2016 |
| WO | 2008065831 | 6/2008 |

OTHER PUBLICATIONS

Examination Report dated Jan. 15, 2021 in GB Patent Application No. 1715849.4.
Examination Report dated Mar. 11, 2020 in EP Patent Application No. 17788364.2.
Examination Report dated Mar. 13, 2020 in EP Patent Application No. 17787082.1.
Examination Report dated Nov. 12, 2020 in GB Patent Application No. 1715848.6.
International Search Report and Written Opinion dated Jan. 19, 2018 in International Patent Application No. PCT/US2017/054895.
International Search Report and Written Opinion dated Apr. 12, 2018 in International Patent Application No. PCT/US2017/054882.
Noronha, E, "Amazon Tap Teardown", iFixit, last updated Apr. 2016, pp. 1-13, available at: https://www.ifixit.com/Teardown/Amazon+Tap+Teardown/61603.
Notice of Allowance dated Jan. 7, 2021 in KR Patent Application No. 10-2019-7012797.
Notice of Allowance dated Jun. 6, 2019 in U.S. Appl. No. 15/717,820.
Notice of Allowance dated Aug. 23, 2019 in U.S. Appl. No. 15/717,811.
Notice of Allowance dated Sep. 3, 2020 in KR Patent Application No. 10-2019-7012794.
Notice of Allowance dated Dec. 4, 2020 in U.S. Appl. No. 16/653,709.
Office Action dated Feb. 9, 2021 in CA Patent Application No. 3,039,355.
Office Action dated Feb. 21, 2019 in U.S. Appl. No. 15/717,820.
Office Action dated Apr. 1, 2020 in CN Patent Application No. 201710898348.0.
Office Action dated Apr. 11, 2019 in U.S. Appl. No. 15/717,811.
Office Action dated Apr. 22, 2020 in CA Patent Application No. 3,039,355.
Office Action dated Jun. 12, 2020 in KR Patent Application No. 10-2019-7012794.
Office Action dated Aug. 9, 2018 in U.S. Appl. No. 15/717,820.
Office Action dated Aug. 19, 2020 in U.S. Appl. No. 16/653,709.
Office Action dated Sep. 1, 2020 in CN Patent Application No. 20170901157.5.
Office Action dated Sep. 24, 2018 in U.S. Appl. No. 15/717,811.
Office Action dated Oct. 30, 2020 in KR Patent Application No. 2019-7012797.
Office Action dated Nov. 30, 2018 in U.S. Appl. No. 15/717,811.
PhoneDog, "Amazon Tap: Alexa-Enabled Portable Bluetooth Speaker Unboxing," last updated Apr. 2016, available at: https://www.youtube.com/watch?v=pe9wDnobiGl&list=ULLBUm9dm7304&index=546.
Elecom, "Bluetooth Wireless Portable Speaker LBT-SPP500 Series", User Manual, last accessed Jun. 29, 2021, pp. 1-2, available at: https://www.elecom.co.jp/support/manual/avd/speaker/lbt-spp500/lbt-spp500_v1.pdf.
Examination Report dated May 7, 2021 in GB Patent Application No. 1715849.4.
Extended European Search Report dated Jun. 28, 2021 in EP Patent Application No. 21177133.2.
Office Action dated May 11, 2021 in JP Patent Application No. 2019-517941.
Office Action dated Jun. 25, 2021 in KR Patent Application No. 10-2021-7008210.
Office Action dated Jul. 6, 2021 in JP Patent Application No. 2019-517946.
Office Action dated Nov. 25, 2021 in CA Patent Application No. 3,039,358.
Office Action dated Dec. 7, 2021 in JP Patent Application No. 2019-517941.

\* cited by examiner

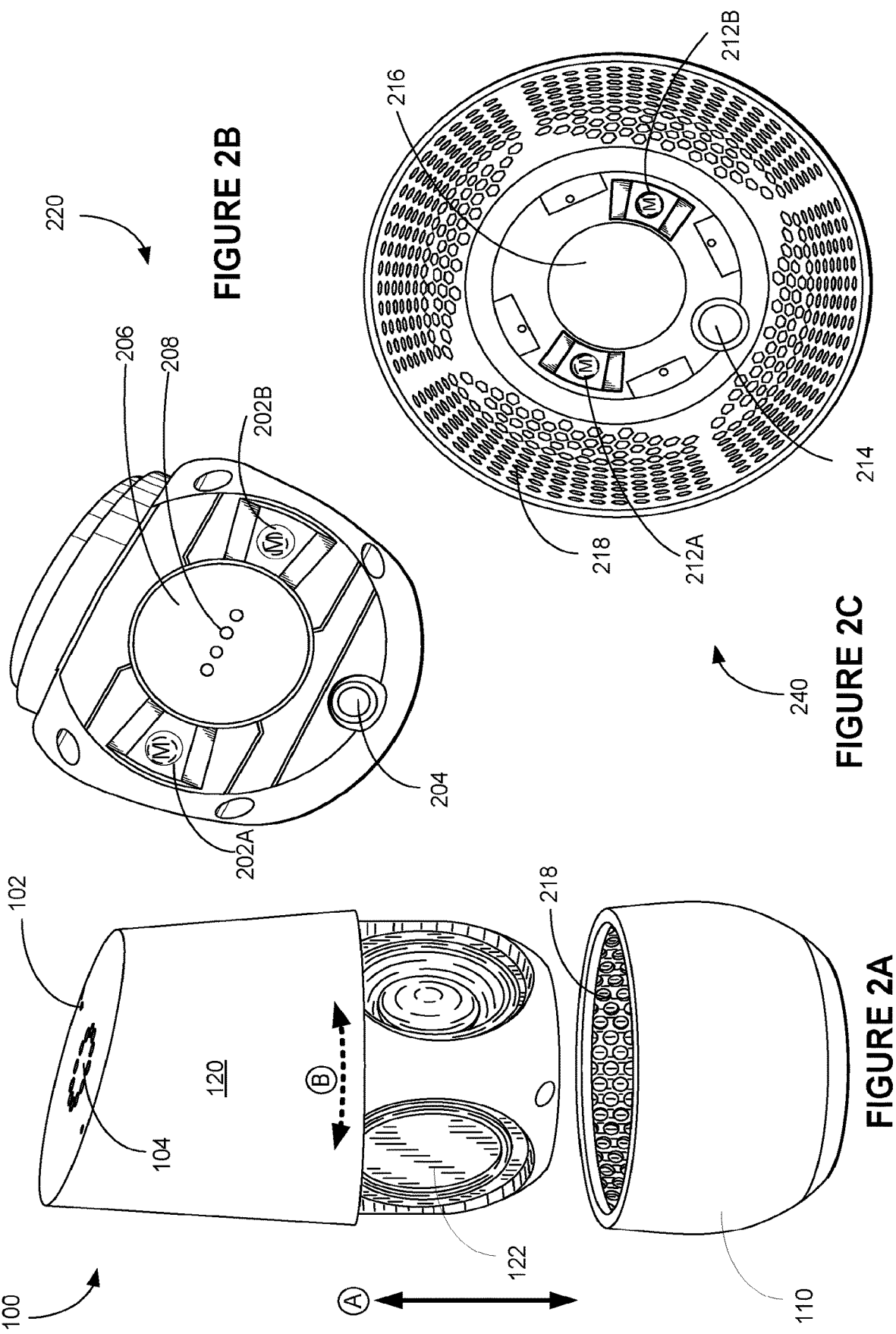

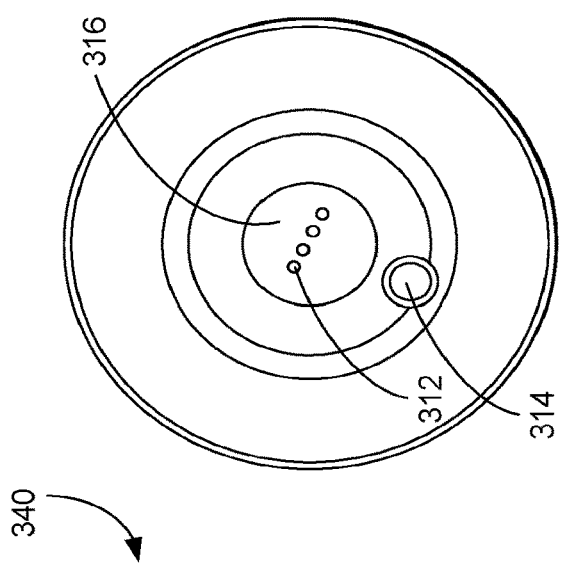
FIGURE 3C
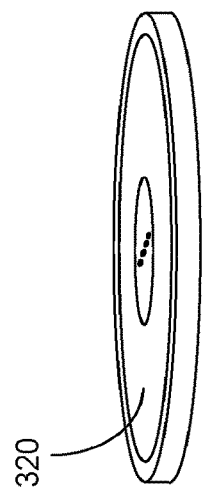
FIGURE 3D
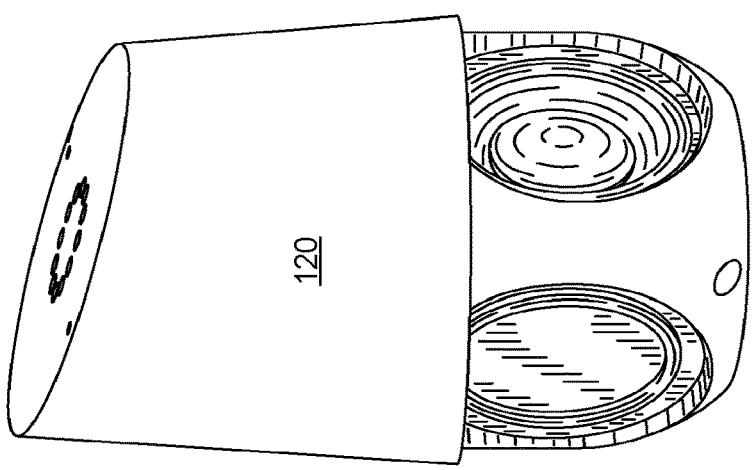
FIGURE 3B
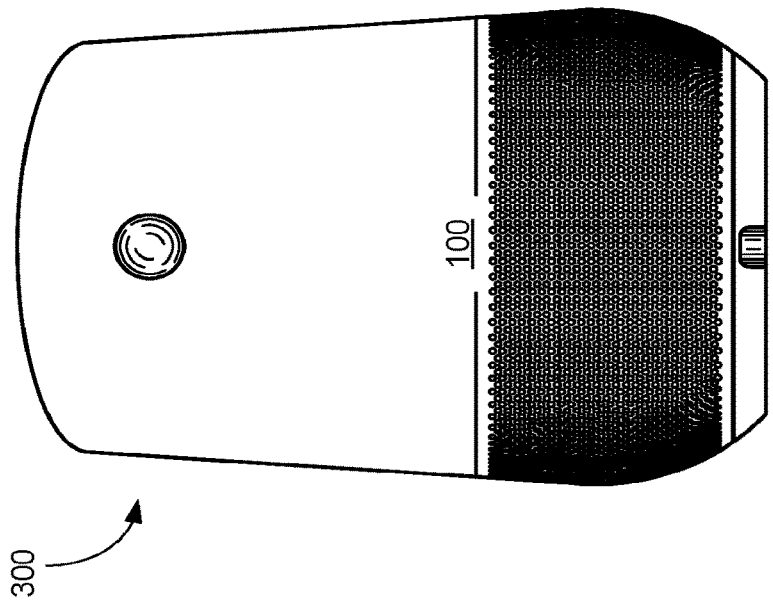
FIGURE 3A
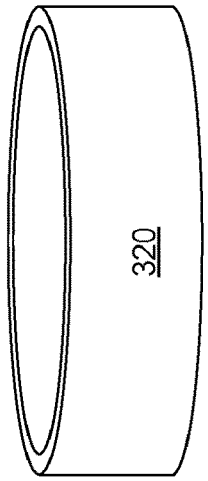

VOICE-ACTIVATED ELECTRONIC DEVICE ASSEMBLY WITH SEPARABLE BASE

CROSS-REFERENCE TO RELATED APPLICATIONS

This application is a continuation of U.S. patent application Ser. No. 16/653,709, filed Oct. 15, 2019, which claims priority to U.S. Provisional Patent Application No. 62/403,681, filed Oct. 3, 2016 and U.S. Provisional Patent Application No. 62/403,685, filed Oct. 3, 2016, each of which is hereby incorporated by reference in its entirety.

This application is related to U.S. patent application Ser. No. 15/717,811 filed Sep. 27, 2017, which is hereby incorporated by reference in its entirety.

TECHNICAL FIELD

This application relates generally to computer technology, including but not limited to methods and systems for providing a voice activated electronic device that is used as a user interface in a smart home or media environment.

BACKGROUND

Electronic devices integrated with microphones have been widely used to collect voice inputs from users and implement different voice-activated functions according to the voice inputs. For example, many state-of-the-art mobile devices include a voice assistant system (e.g., Google Assistant) that is configured to use voice inputs to initiate a phone call, conduct a restaurant search, start routing on a map, create calendar events, add a post to a social network, recognize a song and complete many other tasks. Mobile devices often include display screens that allow users who provide the voice inputs to check the status of the tasks requested via the voice inputs. In some applications, an electronic device having a relatively simple structure and made at a low cost is employed to implement voice activated functions similar to those provided by mobile devices. Use of a display screen would significantly increase the cost of such electronic devices. Thus, there is a need for a simple and low-cost user interface to indicate a status of voice input processing in an electronic device that includes one or more microphones and functions as a voice interface.

In addition, voice activated functions currently implemented in mobile devices are limited to Internet-based functions that involve remote servers (e.g., a search engine, a social network server or a voice assistant server). The results of the voice activated functions are displayed on or used to control the mobile devices themselves (i.e., the mobile devices used to receive voice inputs), and do not impact other remote or local electronic devices accessible to a user. Thus, it would be helpful to enable voice activated electronic devices to act on user voice inputs to impact and/or control other remote or local electronic devices accessible to the user.

It would also be helpful to users if they could conveniently deploy a single voice-activated electronic device in different smart home and/or work environments that would benefit from voice-activated functionality.

SUMMARY

Electronic voice-activated devices are disclosed that provide in a small form factor voice assistant capabilities that enable users to perform a range of activities through natural language voice commands, including one or more of: controlling local and remote electronic devices, issuing requests for services and information to remote servers, and/or sending media information to other electronic devices for consumption by the user or other users. In some implementations electronic voice-activated devices include visual indicators, such as one or more full-color LEDs, that are used to indicate the status of voice processing associated with a spoken user request. In some implementations, electronic voice activated devices include one or more speakers that can be used to relay audible information to a user to provide an answer to a user request (such a search query or a request for a basketball score), provide a spoken status of a voice processing operation, play a musical selection, and/or read digest of current news or the current weather forecast. Given that voice inputs are convenient for users, some implementations allow a user to use voice inputs to control other electronic devices accessible to the user in addition to requesting Internet-based services and functions from remote servers and mobile devices.

Accordingly, implementations of electronic devices are described herein that provide an eyes-free and hands-free voice interface to enable users to activate voice-activated functions on associated media player devices, issue information requests to remote servers, consume audible information or media, and/or control smart home or smart media devices coupled within the voice-activated electronic devices in a smart media or smart home environment. In various implementations described herein, a smart media environment includes one or more voice-activated electronic devices and multiple media display devices each disposed at a distinct location. In some implementations, these devices are coupled to a cast device (e.g., a set top box, a Google Chromecast™ device or a smart TV). These devices can be directed via voice requests issued to a voice-activated device to play media items identified verbally by a user.

In some implementations, a smart home environment as described herein includes a wide range of environments/applications in which voice activated electronic devices can be employed to provide a variety of voice activated functions. For example, these applications include deployment of voice activated electronic devices in work/office environments to control work/office devices or provide on in-environment displays information responsive to user voice inputs. Network-connected and voice-activated electronic devices can also be employed, without limitation, in transportation, public, sporting and/or similar environments that provide compatible form factors and electrical and/or mechanical features to provide compatible electronic devices with convenient electrical connections (e.g., to provide/receive data signals and/or power and/or an additional user interface or display) and physical connections (e.g., to securely but temporarily position a device in a convenient location).

For example, using physical and electrical connection features described herein, a single voice activated electronic device of a user can be temporarily deployed in the user's automobile, at the user's office, in different home entertainment devices, or at a public meeting location, to provide environmentally appropriate voice activated features via a familiar voice interface (trained in some instances to recognize and respond optimally to the particular user). In addition, the device connection features described herein, including compatible form factors and electrical and/or mechanical features, enable development of multiple different types of compatible voice-activated devices and compatible mounting structures that allow users to easily connect and move their respective voice activated and networked voice activated devices between different environments and applications. Collectively or individually, for the purposes of this application, all of these different environments and applications are considered to be smart home or smart media environments that would benefit from application of the described device connection and portability features.

Network-connected and voice-activated electronic devices are normally placed on surfaces at different locations of a smart home environment. As such, in some implementations electronic voice assistant devices are configured to have a form factor and appearance that matches the overall smart home environment and/or can be integrated with multiple compatible surfaces and devices throughout the environment. For example, in some implementations a voice-activated electronic device includes a separable base that can be replaced to enable better matching to surface finishes in a variety of home environments. In some implementations, the separable bases are separable grills with a variety of surface appearances, such as cloth, leather, metallic, and smooth. In some implementations, the base is connected to an upper portion of an electronic device via magnetic attraction, which enables the base and upper portion of an electronic device to be fastened securely but separable using manual user manipulation. In some implementations, the base and the upper portion can be separated using a twisting motion followed by a separation motion and in some implementations the base and the upper portion can be separated using only a separation motion.

In some implementations, the base has a circular cross-section and includes a circular opening at a first surface that allows a power and/or data connector (i.e., electrical connector) in the upper portion (which contains electronic components of the electrical device) to connect through the circular opening to a compatible external power and/or data connector. In some implementations, the electrical connector in the upper portion is substantially planar. As such, electrical devices designed in accordance with the descriptions herein can be coupled to a wide range of different surfaces, compatible bases, docks and/or other electronic devices that provide power and/or data, or that receive data output by the electronic device (e.g., data generated by programs executed by the device), via a compatible external power and/or data connector. In some implementations, the electrical connector provided by the electronic device includes multiple small electrical contacts in a substantially planar arrangement. In some examples, the connector includes 4 electrical contacts arranged in a line.

In accordance with one aspect of this application, an electronic device includes a first portion with a first internal surface having a first attachment structure and a first external surface that extends beyond the first internal surface in a direction opposite the first attachment structure, and a second portion with a second internal surface having a second attachment structure and a circular opening. The first and second internal surfaces have compatible shapes that permit the first and second portions to be moved from a separated position to a joined position by movement of the first internal surface through the circular opening of the second portion, such that when the first portion and the second portion are in the joined position the first and second internal surfaces form a nested arrangement that allows for interaction between the first and second attachment structures and the extended portion abuts the second portion. The first and second attachment structures are configured to form a secure but separable connection to one another via magnetic attraction when the first and second portions are in the joined position. The first portion and the second portion being configured to be joined securely and separated through manual human manipulation of one or both of the first portion and the second portion to move the first and second portions between the separated and joined positions.

In accordance with one aspect of the application, a cover portion for an electronic device includes a base portion with a second internal surface having a second attachment structure and a circular opening. The base portion is configured to join with a first portion of the electronic device with a first internal surface having a first attachment structure and a first external surface that extends beyond the first internal surface in a direction opposite the first attachment structure. The second internal surface is configured to permit movement of the first internal surface through the circular opening of the base portion, such that when the first portion and the second portion are moved into a joined position (e.g., FIGS. 1A and 1B) from a separated position (e.g., FIG. 2A) the first and second internal surfaces form a nested arrangement that allows for interaction between the first and second attachment structures and the extended portion abuts the second portion. The second attachment structure is configured to form a secure but separable connection to the first attachment structure via magnetic attraction when the first and second portions are in the joined position. The base portion=is configured to be joined securely to and separated from the first portion through manual human manipulation of one or both of the first portion and the second portion to move the first and second portions between the separated and joined positions.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIG. 2A is a perspective view of an example voice-activated electronic device that shows speakers contained in a base of the electronic device in an open configuration in accordance with some implementations.

FIG. 2B is a bottom view of a upper portion of an example voice-activated electronic device that includes speakers in accordance with some implementations.

FIG. 2C is a top view of a base of an example voice-activated electronic device that is configured to contain speakers of a upper portion in accordance with some implementations.

FIG. 3A is an example electronic system including a voice-activated electronic device and a docking device in accordance with some implementations.

FIG. 3B is another example electronic system including a upper portion of a voice-activated electronic device and a docking device in accordance with some implementations.

FIG. 3C is a top view of an example docking device configured to receive a voice-activated electronic device or a upper portion of a voice-activated electronic device in accordance with some implementations.

FIG. 3D is an example low-profile docking station configured to receive a moveable voice-activated electronic device in accordance with some implementations.

Like reference numerals refer to corresponding parts throughout the several views of the drawings.

DESCRIPTION OF IMPLEMENTATIONS

Figure 1B:
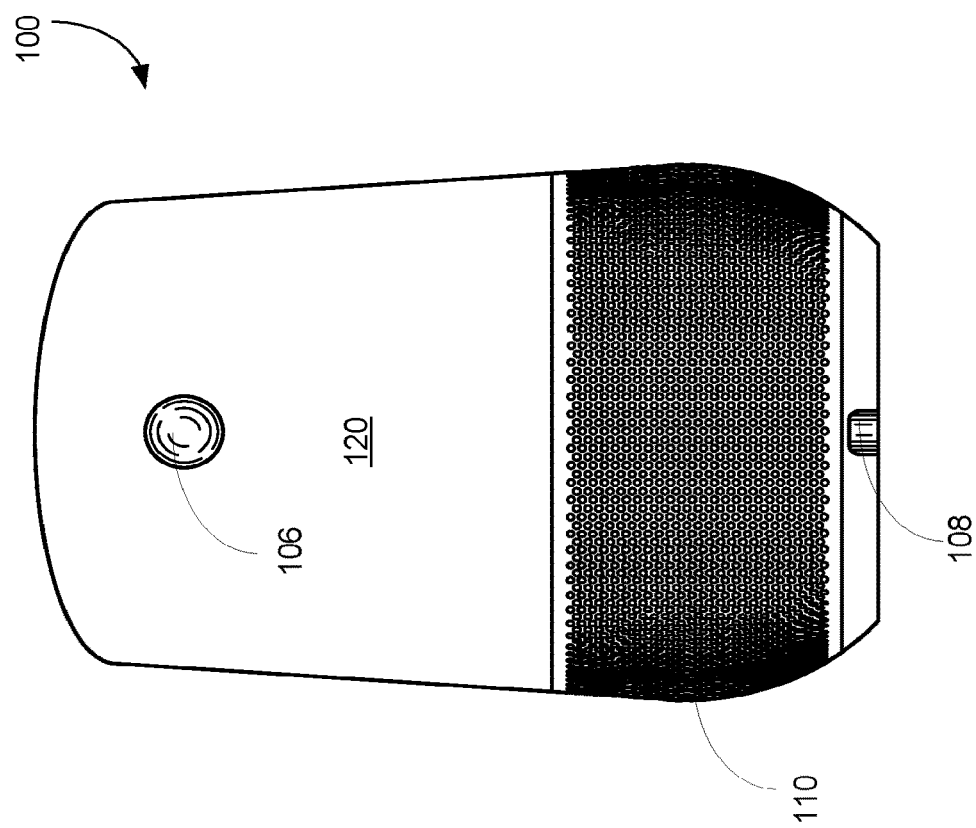
FIGS. 1A and 1B are a front view and a rear view of an example voice-activated electronic device in accordance with some implementations.

The digital revolution has provided many benefits ranging from enabling open sharing of information to a sense of global community. However, emerging new technologies often induce confusion, skepticism and fear among consumers, preventing consumers from benefitting from the technology. Electronic devices are conveniently used as voice interfaces to receive voice inputs from users and initiate voice-activated functions, and thereby offer eyes-free and hands-free solutions for enabling simple and productive user interaction with both existing and emerging technology. Specifically, the voice inputs received at an electronic device with voice activated features can carry instructions and information even if a user's line of sight is obscured and his or her hands are occupied. To enable a hands-free and eyes-free experience, a voice-activated electronic device in accordance with the present invention "listens" to the ambient (i.e., processes audio signals collected from the ambient) constantly or only when triggered to do so (e.g., via user utterance of a "hot word" to trigger operation of the electronic device. On the other hand, user identities are linked with a user's voice and a language used by the user. To protect user identities, these voice-activated electronic devices are normally used in non-public places that are protected, controlled and intimate spaces (e.g., home and car), but use in public locations is also possible and is made convenient through implementation of the device portability and connection features described herein.

Specifically, in some implementations, an electronic device provides an eyes-free and hands-free voice interface to activate voice-activated functions on other media play devices or smart home devices coupled within a smart media or home environment. The smart media environment includes one or more voice-activated electronic devices and multiple media display devices each disposed at a distinct location. Some of the electronic devices are coupled to or include a cast device (e.g., a set top box or a media streaming device) that can cast via a wireless network a media session from one device to a networked display device. Each voice-activated electronic device is configured to capture/record a voice message from which a server determines a user voice request (e.g., a media play request, a media transfer request or a closed caption initiation request). The server then directs the user voice request to a destination cast device as indicated by the voice message. In some implementations, the server includes a media server (sometimes referred to as a "cloud cast" device) that transmits user-designated media content to a user-designated media playback device (e.g., in some implementations, both the media content and the media playback device are designated by a voice command captured by the electronic device and transmitted to the server). Similar arrangements can be used to control smart home devices to implement voice-activated functions in a smart home environment. Such methods optionally complement or replace conventional methods of requiring a user to use a remote control or a client device to control the media devices or the smart home devices in a smart media or home environment.

In accordance with various implementations described herein, network-connected and voice-activated electronic devices are normally placed on surfaces at different locations of the smart home environment. Each voice-activated electronic device is configured to have a form factor that matches the overall smart home environment. For example, each voice-activated electronic device includes a base that could match and come into contact with different types of surfaces including a desktop, a furniture surface, a docking station, a media player device or other surfaces. Such a voice-activated electronic device is configured to couple to its base in a compact and robust manner, thereby merging into various home environments naturally.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Figure 1A:
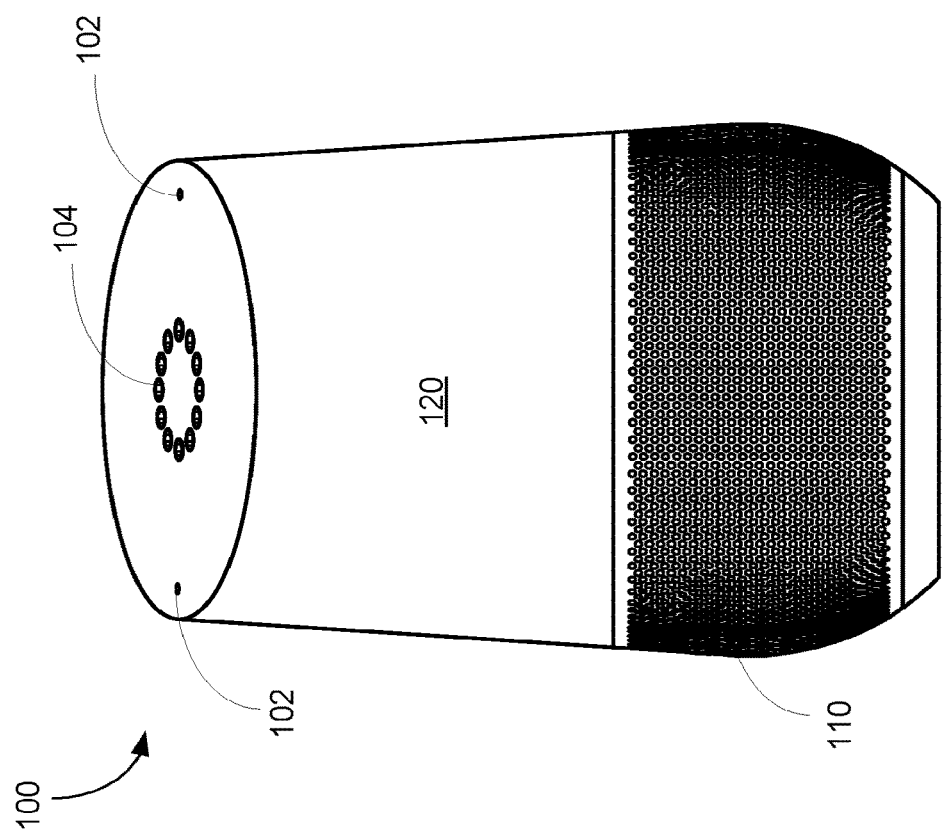

FIGS. 1A and 1B are a front view and a rear view of an example voice-activated electronic device 100 in accordance with some implementations. The electronic device 100 includes an overall exterior including an upper portion 120 and a base portion 110, and electronic components contained within the overall exterior. The electronic device 100 is designed to have a warm and inviting appearance to allow it to fit naturally in many areas of a home. In some implementations, the electronic device 100 includes one or more microphones 102 and an array of full color LEDs 104. The full color LEDs 104 could be hidden under a top surface of the electronic device 100 and be invisible to the user when they are not lit. In some implementations, the array of full color LEDs 104 is physically arranged in a ring. In some implementations, the LEDs have different color ranges and configurations as appropriate to different smart home environments. Further, the rear side of the electronic device 100 optionally includes a power supply connector 108 configured to couple to a power supply.

In some implementations, the electronic device 100 presents a clean look having no visible buttons, and the interaction with the electronic device 100 is based on voice and touch gestures. Alternatively, in some implementations, the electronic device 100 includes a limited number of physical buttons (e.g., a button 106 on its rear side), and the interaction with the electronic device 100 is further based on a press on the button in addition to the voice and touch gestures.

FIG. 2A is a perspective view of a voice-activated electronic device 100 that shows speakers 122 contained in a base 110 of the electronic device 100 in an open configuration in accordance with some implementations. One or more speakers 122 are disposed and concealed in the electronic device 100. The base 110 of the electronic device 100 has a porous or acoustically transparent wall to allow sound waves generated by the speaker 122 to penetrate (i.e., be heard beyond) the base 110. More specifically, the electronic device 100 includes an upper portion 120 with a first internal surface having a first attachment structure and a first external surface that extends beyond the first internal surface in a direction opposite the first attachment structure. The electronic device 100 further includes the base portion 110 with a second internal surface having a second attachment structure and a circular opening 218. The first and second internal surfaces having compatible shapes that permit the first and second portions to be moved from a separated position (shown in FIG. 2A) to a joined position (shown in FIGS. 1A and 1B) by movement of the first internal surface through the circular opening of the second portion, such that when the upper portion 120 and the base portion 110 are in the joined position the first and second internal surfaces form a nested arrangement that allows for interaction between the first and second attachment structures and the extended portion abuts the second portion. In some implementations, the nested arrangement allows for interaction between the first and second attachment structures not possible when the upper and base portions in the separated position. The first and second attachment structures are configured to form a secure but separable connection to one another when the first and second portions are in the joined position. The upper portion 120 and the bottom portion are configured to be joined securely and separated through manual human manipulation of one or both of the upper portion 120 and the base portion 110 to move the first and second portions between the separated and joined positions.

Optionally, the first internal surface having the first attachment structure is fixed on the upper portion 120, and concealed within the electronic device when the upper and base portions are in the joined position. Optionally, the second internal surface having the second attachment structure is fixed on the base portion 110, and concealed within the electronic device when the upper and base portions are in the joined position. In some implementations, the first and second attachment structures are configured to form the secure but separable connection to one another via magnetic attraction when the upper and base portions are in the joined position. More details on the first and second attachment structures are explained with reference to FIGS. 2B and 2C. In some implementations, human manipulation is applied on external surfaces of one or both of the upper and base portions, and does not involve any tool to facilitate joining or separating the upper and base portions of the electronic device 100.

In some implementations, the electronic device 100 includes a subset of an array of full color LEDs 104, one or more microphones 102, one or more speakers 122, dual-band WiFi 802.11ac radio(s), a Bluetooth LE radio, an ambient light sensor, a USB port, a processor and memory storing at least one program for execution by the processor. Further, in some implementations, the electronic device 100 further includes a touch sense array configured to detect touch events on the top surface of the electronic device 100. The touch sense array is disposed and concealed under the top surface of the electronic device 100. In some implementations, the touch sense array arranged on a top surface of a circuit board including an array of via holes, and the full color LEDs are disposed within the via holes of the circuit board. When the circuit board is positioned immediately under the top surface of the electronic device 100, both the full color LEDs 104 and the touch sense array 124 are disposed immediately under the top surface of the electronic device 100 as well.

In some implementations, the top portion 120 further includes electronic components and includes an electrical connector 204 configured to supply power to the electronic components when connected to an external power supply. The base portion 110 includes a cover portion and includes a second external surface with a second opening configured to allow access to the second interior surface, such that when the first portion and the second portion are joined, the first external surface and the second external surface form an overall exterior of the electronic device and the second opening 214 in the second external surface is aligned with the electrical connector so as to enable power to be supplied to the electronic components when the electrical connector is connected to the external power supply via a power connector inserted through the second opening 214. In some implementations, the upper and base portions 120 and 110 have a first internal surface and a second internal surface, respectively. A joint is applied at an interface between the first and second internal surfaces of the upper and base portions 120 and 110 to join the upper and base portions 120 and 110. Further, the upper portion 120 can be joined separately with any number of third portions having third internal surfaces and third attachment structures that have same configuration respectively as the second internal surface and the second attachment structure of the base portion 110, thereby enabling the electronic device 100 to present a variety of cover portions in combination with the first external surface.

Referring to FIG. 2A, in some implementations, the human manipulation to move the upper and base portions 120 and 110 from the joined position (FIGS. 1A and 1B) to the separated position (FIG. 2A) includes a rotational motion B of the upper and base portions sufficient to separate the secure but separable connection between the first and second attachment structures. Further, in some implementations, the human manipulation to move the upper and base portions 120 and 110 from the joined position (FIGS. 1A and 1B) to the separated position (FIG. 2A) includes a rotational motion B of the upper and base portions sufficient to separate the secure but separable connection between the first and second attachment structures followed by a separating motion A of the first and second portions.

Alternatively, in some implementations, the human manipulation to move the upper and base portions 120 and 110 from the separated position (FIG. 2A) to the joined position (FIGS. 1A and 1B) includes a closing motion A of the upper and base portions until the first and second attachment structures are in position to form the secure but separable connection. In some implementations, the human manipulation to move the upper and base portions 120 and 110 from the separated position (FIG. 2A) to the joined position (FIGS. 1A and 1B) includes a closing motion A of the upper and base portions followed by a rotational motion B of the upper and base portions until the first and second attachment structures are in position to form the secure but separable connection. In some implementations, the upper portion 120 can be joined separately with any number of third surfaces having third internal surfaces and third attachment structures that have compatible configurations respectively with the second internal surface and the second attachment structure of the base portion 110, thereby enabling the upper portion 120 to mate with a secure but separable connection with a variety of compatible surfaces.

Figure 2D:
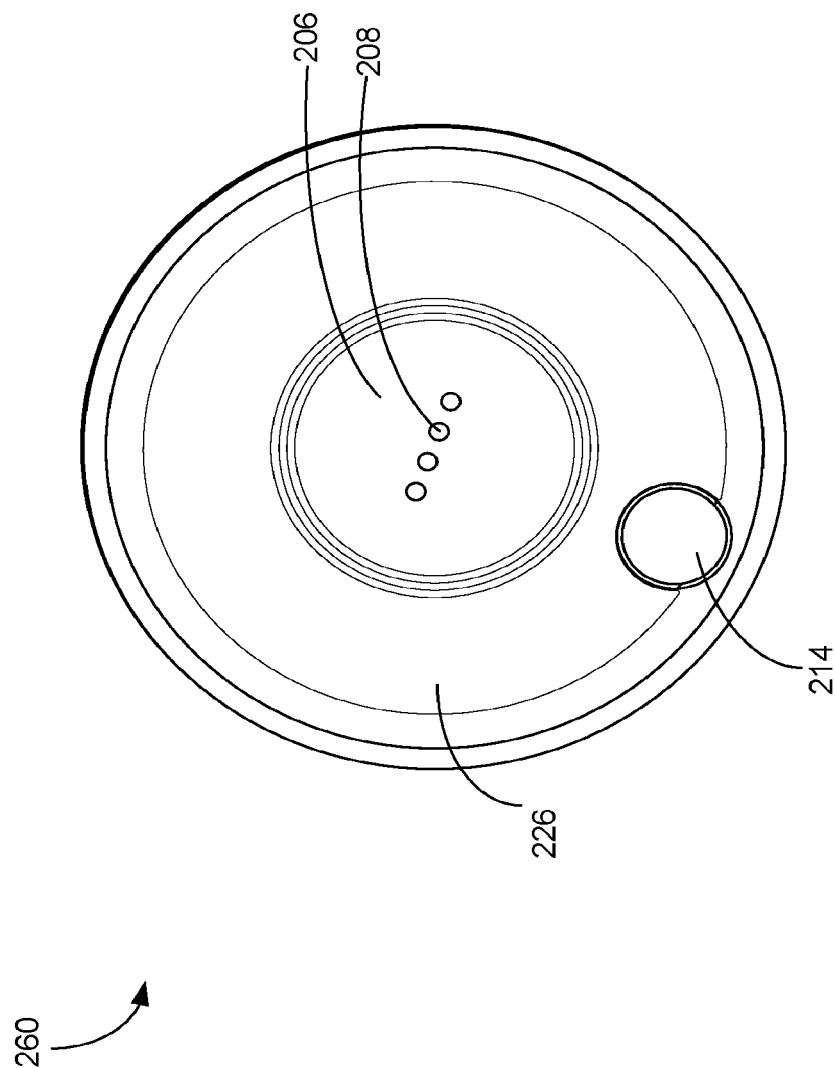
FIG. 2D is a bottom view of an example voice-activated electronic device in which speakers of a upper portion is assembled within a base in accordance with some implementations.
Figure 2F:
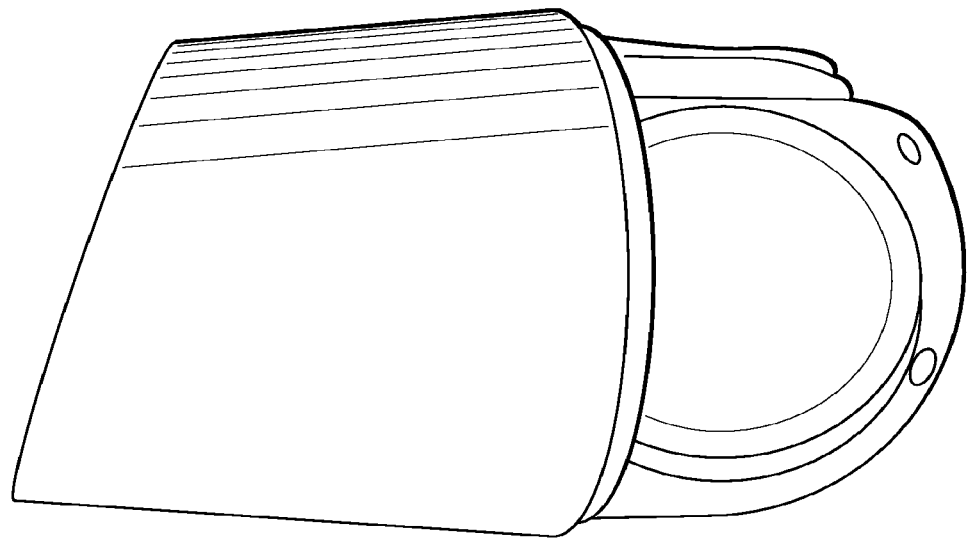
FIGS. 2E and 2F are a front view and a side view respectively of a top portion of an electronic device.
Figure 2E:
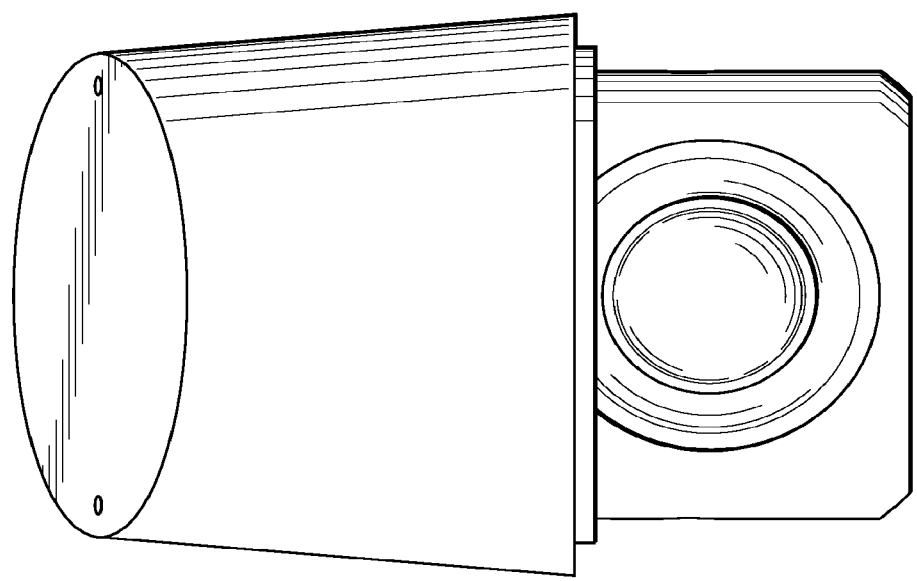

In some implementations, the first and second attachment structures are configured to form the secure but separable connection to one another via magnetic attraction when the upper and base portions are in the joined position. FIG. 2B is a bottom view 220 of a upper portion 120 of an example voice-activated electronic device 100 that includes speakers 122 in accordance with some implementations, and FIG. 2C is a top view 240 of a base portion 110 of an example voice-activated electronic device 100 that is configured to contain speakers 122 of a upper portion 120 in accordance with some implementations. FIG. 2D is a bottom view of an example voice-activated electronic device in which speakers of a upper portion is assembled within a base in accordance with some implementations.

The upper portion 120 includes one or more first attachment structures 202 and a contact pin port 208 both located on the bottom surface 206 of the upper portion 120. The upper portion 120 further includes a power supply port 204 located on a side surface that is recessed from the bottom surface 206, and the power supply port 204 is configured to receive a power supply connector. The base portion 110 includes one or more second attachment structures 212, a second opening 214 and a first opening 216 all of which are located on the internal bottom surface of the base portion 110. Referring to FIG. 2D, when the upper portion 120 and the base portion 110 are joined in its joined position, the bottom surface 206 is exposed from the first opening 216, and the power supply port 204 of the upper portion 120 is exposed from the second opening 214 of the base portion 110, allowing a power connector to access the power supply port 204. In some implementations, the opening 216 in the base portion 110 is circular and is annular with the circular opening 218 of the base portion 110. The opening 216 in the base portion 110 is located at a bottom side.

Optionally, referring to FIG. 2B, each of the first attachment structures 202 of the upper portion 120 includes a magnet ("M"), and each of the second attachment structures 212 of the base portion 110 is made of magnetically attractable material. Optionally, referring to FIG. 2C, each of the second attachment structures 212 includes a magnet ("M"), and each of the first attachment structures 202 is made of magnetically attractable material.

Magnetic attraction between the first and second attachment structures 202 and 212 is strongest when the first and second attachment structures 202 and 212 are in a first preferred orientation with respect to one another. The first preferred orientation is a subset of possible orientations of the first and second attachment structures 202 and 212 with respect to one another. In an example, in accordance with a first possible orientation, the first and second attachment structures 202 and 212 are in the first preferred orientation when the first attachment structures 202A and 202B are aligned with the second attachment structures 212A and 212B, respectively. In another example, in accordance with a second possible orientation, the first and second attachment structures 202 and 212 are in the first preferred orientation, when the first attachment structure 202A is aligned with the second attachment structure 212B and the first attachment structure 202B is aligned with the second attachment structure 212A. Further, in some implementations, the first and second attachment structures 202 and 212 are in the first preferred orientation when the upper and base portions are in a second preferred orientation with respect to one another. In the second preferred orientation, the upper portion 120 and the base portion 110 are aligned such that the power supply port 204 of the upper portion 120 and the opening 214 of the base portion overlaps to allow a power connector to access the power supply port 204 when the upper and base portions are assembled.

In some implementations, the first and second attachment structures 202 and 212 have complimentary surface topologies that are configured to mesh when the first and second attachment structures 202 and 212 are in the preferred orientation. For example, the second attachment structures 212A and 212B are raised above the internal bottom surface of the base portion 210, and have a second profile and a second raised height. The first attachment structures 202A and 202B are recessed from surfaces on which the first attachment structures 202A and 202B are situated, and have a first profile and a first recess depth. Optionally, the first and second profiles match each other. Optionally, the first recess depth and the second raised height are consistent with each other.

In some implementations, the complimentary surface topologies of the first and second attachment structures are further configured to guide the first and second attachment structures 202 and 212 into the preferred orientation from a non-preferred orientation. The difference between the preferred and the non-preferred orientation is detectable by a human who is manually manipulating the first and second portions into the joined position. In some implementations, the complimentary surface topologies are configured to guide the first and second attachment structures 202 and 212 into the preferred orientation in response to rotation of the upper portion 120 with respect to the base portion 110 (e.g., along a direction B in FIG. 2A). Further, in some implementations, there is a visible gap between external surfaces of the upper and base portions 120 and 110 when the first and second attachment structures 202 and 212 are in the non-preferred orientation. The external surfaces of the upper and base portions form a contiguous surface when the first and second attachment structures are in the non-preferred orientation. In some implementations, a joint is discernible at an interface between the external surfaces of the upper and base portions.

In some implementations, the complimentary surface topologies comprise one of the first and second attachment structures (202 or 212) having a indented polygonal structure and other of the first and second attachment structures (212 or 202) having a projecting polygonal structure that is complimentary in shape to the indented polygonal structure, such that the indented and projecting structures mate with each other when the upper and base portions 120 and 110 are in the second preferred orientation. In some implementations, the polygonal structures comprise ramp-shaped structures.

Referring to FIGS. 2B-2D, in some implementations, an electronic device 100 includes an overall exterior further including an upper portion 120 and a base portion 110. The electronic components contained within the overall exterior include a first electrical connector 208 (also called a contact pin port 208) configured to supply power and/or data to the electronic components and/or to output data signals from the electronic components when the first electrical connector 208 is connected to an external power and/or data connector. The first electrical connector 208 includes a plurality of first electrical contacts configured in a pattern that is substantially co-planar with a base surface 206 of the electronic components. Optionally, the first contacts are arranged in a line. The base portion includes a first opening 216 corresponding to a position and size of the first electrical connector 208 in the base surface of the electronic components. The first opening 216 is configured to enable the first electrical contacts 208 of the first electrical connector to couple electrically with corresponding second electrical contacts of the external power and/or data connector provided at a second surface external to the electronic device 100. In some implementations, the connection between the electronic device and the compatible external data and/or power connection is maintained by gravity.

In some implementations, the power and/or data connector is configured to provide DC operating power to the electronic components. In some implementations, the power and/or data connector is configured to provide a hard wired network connection to the electronic components. In some implementations, the power and/or data connector is configured to output digital signals that are provided by one or more software applications executed by the electronic components. The digital signals convey one or more of video information, audio information, user interaction information, including audible instructions, control data, and location information.

In some implementations, when the second surface is provided at a gaming system, the electronic components are configured to output user gaming inputs conveyed by a user via capabilities of the electronics components. In some implementations, when the second surface is provided at an audio system, the electronic components are configured to output audio information conveyed via capabilities of the electronics components. In some implementations, when the second surface is provided at a digital media player system, the electronic components are configured to output digital medial information conveyed via capabilities of the electronics components. In some implementations, when the second surface is provided at an audio system, the electronic components are configured to output audio information conveyed via capabilities of the electronics components. In some implementations, when the second surface is provided at a mobile electronic system, the electronic components are configured to output control information to control movement of the mobile electronics system conveyed by capabilities of the electronics components, the capabilities reflecting one or more of user commands and outputs of applications executed by the electronics components.

It is noted that the upper portion 120 and the base portion 110 are separable. In some implementations, the upper portion 120 is coupled to the electronic components, thereby enabling replacement of the base portion 110 with different compatible base portions 110, each of the different compatible base portions 110 including a second opening 216 corresponding in size and position to the first opening 216 of the base portion 110. As explained above, in some implementations, the upper portion 120 and the base portion 110 are configured to be joined securely and separated through manual human manipulation of one or both of the upper portion 120 and the base portion 110. Further, in some implementations, the upper portion 120 includes a first internal surface having a first attachment structure 202 and a first external surface that extends beyond the first internal surface in a direction opposite the first attachment structure 202. The first internal surface defines a periphery of the electronic components. The base portion 110 includes a second internal surface having a second attachment structure 212 and a circular opening 218. The first and second internal surfaces have compatible shapes that permit the upper and base portions to be moved from a separated position to a joined position by movement of the first internal surface through the circular opening 218 of the base portion 110, such that when the upper portion 120 and the base portion 110 are in the joined position the first and second internal surfaces form a nested arrangement that allows for interaction between the first and second attachment structures 202 and 212 and the extended portion abuts the base portion 110.

In some implementations, the electrical contacts 208 are substantially flat and the base portion 110 is substantially flat, thereby enabling the electronic device 110 to connect to corresponding electrical contacts of a substantially flat external power and/or data connector.

In accordance with one aspect of the application, a cover portion for an electronic device includes a base portion 110 with a second internal surface having a second attachment structure and a circular opening 218. The base portion 110 is configured to join with a first portion of the electronic device with a first internal surface having a first attachment structure and a first external surface that extends beyond the first internal surface in a direction opposite the first attachment structure. The second internal surface is configured to permit movement of the first internal surface through the circular opening of the base portion, such that when the first portion and the second portion are moved into a joined position (FIGS. 1A and 1B) from a separated position (FIG. 2A) the first and second internal surfaces form a nested arrangement that allows for interaction between the first and second attachment structures and the extended portion abuts the second portion. The second attachment structure is configured to form a secure but separable connection to the first attachment structure via magnetic attraction when the first and second portions are in the joined position. The base portion 110 is configured to be joined securely to and separated from the first portion through manual human manipulation of one or both of the first portion and the second portion to move the first and second portions between the separated and joined positions.

Figure 4A:
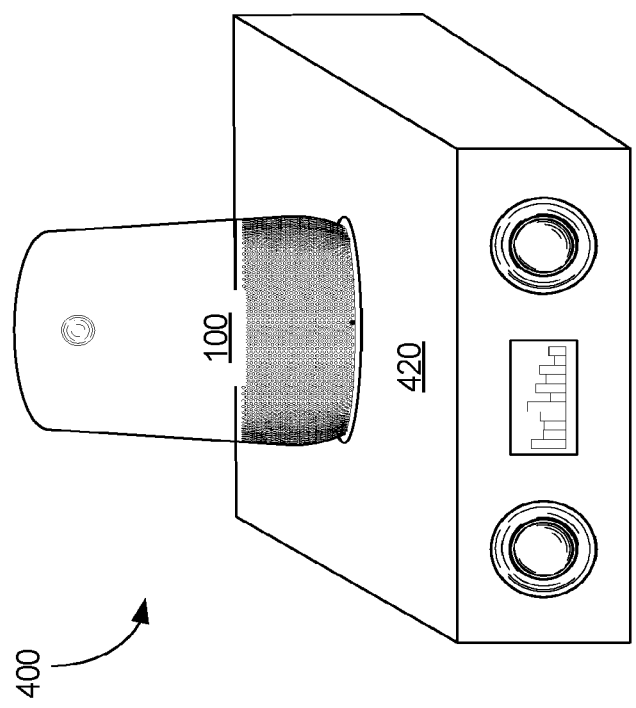
FIG. 4A is an example electronic system in which a voice-activated electronic device is placed on a docking interface of a media player in accordance with some implementations.
Figure 4B:
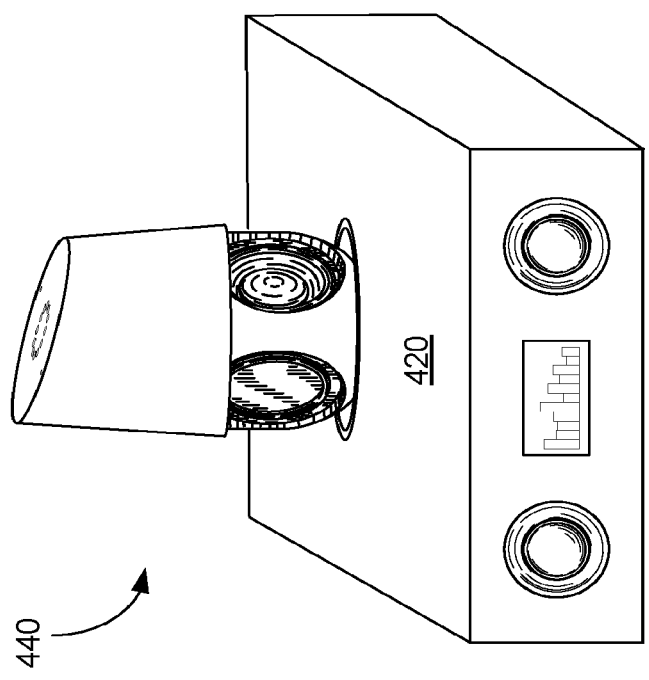
FIGS. 4B and 4C are two example electronic systems in which a upper portion of a voice-activated electronic device is placed on and partially contained within a docking interface of a media player in accordance with some implementations, respectively.
Figure 4C:
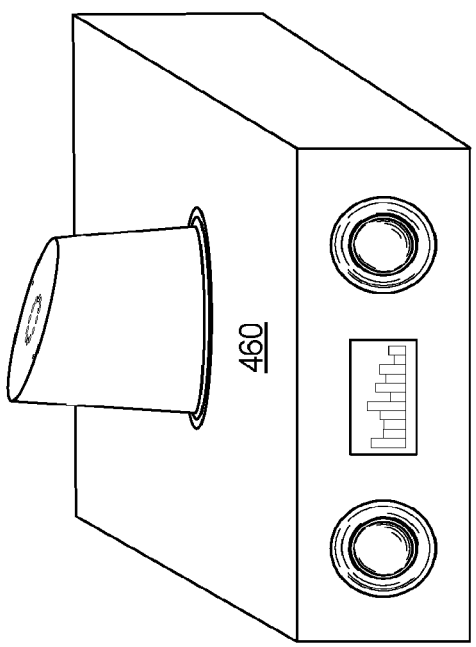

FIG. 3A shows an example electronic system 300 including a voice-activated electronic device 100 and a docking device 320 in accordance with some implementations. FIG. 3B is another example electronic system 340 including a upper portion 120 of a voice-activated electronic device 100 and a docking device 320 in accordance with some implementations. FIG. 3C is a top view of an example docking device 320 configured to receive a voice-activated electronic device 100 or an upper portion 120 of a voice-activated electronic device 100 in accordance with some implementations. FIG. 3D is an example low-profile docking station 320 configured to receive a moveable voice-activated electronic device 100 in accordance with some implementations. FIG. 4A is an example electronic system 400 in which a voice-activated electronic device 100 is placed on a docking interface of a media player 420 in accordance with some implementations. FIGS. 4B and 4C show two example electronic systems 440 and 460 in which an upper portion of a voice-activated electronic device 100 is placed on and partially contained within a docking interface of a media player 420 in accordance with some implementations, respectively.

As explained above, an electronic device 100 includes an overall exterior further including an upper portion 120 and a base portion 110. The base portion includes a first opening 216 corresponding to a position and size of the first electrical connector 208 in the base surface of the electronic components. The first opening 216 is configured to enable the first electrical contacts 208 of the first electrical connector to couple electrically with corresponding second electrical contacts 312 of the external power and/or data connector provided at a second surface external to the electronic device 100. Referring to FIGS. 3A-3D, in some implementations, the second surface external to the electronic device 100 configured to provide the second electrical contacts 312 of the external power and/or data connector is part of a stand-alone docking station 320. The docking station 320 is configured to electrically couple to the electronic device 100 when the electronic device 100 includes the base portion 110 (FIG. 3A) or does not include the base portion 110 (FIG. 3B). In some implementations, part of the top surface 316 of the docking station 320 is substantially flat, thereby enabling the electronic device 110 to connect to the second electrical contacts 312 of the substantially flat external power and/or data connector on the docking station 320.

In some implementation, the docking station 320 further includes a power connector 314 configured to mate with the power supply port 204 of the electronic device 100 and provide power to the electronic device when the electronic device 100 is mounted onto the docking station 320 according to a preferred orientation. At the preferred orientation, the second electrical contacts 312 and the power connector 314 of the docking station 320 are aligned with the first electrical contacts 208 and the power supply port 204 of the electronic device 100, respectively.

Referring to FIG. 3D, in some implementations, an electronic device 100 is capable of movement and includes a motor configured to cause movement of the electronic device 100. In some implementations, such moveable electronic device 100 is configured to move onto a docking station 320 to access a power source at the docking station 320 and/or exchange data with/via the docking station 320. The docking station 320 has a substantially low profile, such that the electronic device 100 can move onto the low-profile docking station 320. In some implementations, the electronic device 100 aligns itself with the docking station 320 in accordance with locations and an orientation of the electrical contacts 312. Similarly, an electronic device can be docked onto a surface of a device (e.g., a household robot) capable of movement that provides data and power connections at the surface via a compatible external connector, thereby enabling the electronic device 100 to direct movement of the surface.

In some implementations, the second surface external to the electronic device 100 configured to provide the second electrical contacts 312 of the external power and/or data connector is integrated on a surface of a counter, furniture (e.g., a TV stand), or an appliance (e.g., a media player 420). Referring to FIG. 4A-4C, in some implementations, the media player 420 has a docking surface configured to electrically couple to the electronic device 100 when the electronic device 100 includes the base portion 110 (FIG. 3A) or does not include the base portion 110 (FIG. 3B). Optionally, the docking surface of the media player 420 includes the second electrical contacts 312 providing access to external power and/or data to the electronic device 100. In some implementations, the electronic device 100 is situated substantially on top of the media player 420 when it is mounted onto the media player 420 to receive power and/or exchange data. Alternatively, in some implementations, a speaker portion or the base portion 110 of the electronic device 100 is substantially contained within the media player 420 when it is mounted onto the media player 420 to receive power and/or exchange data.

Figure 5B:
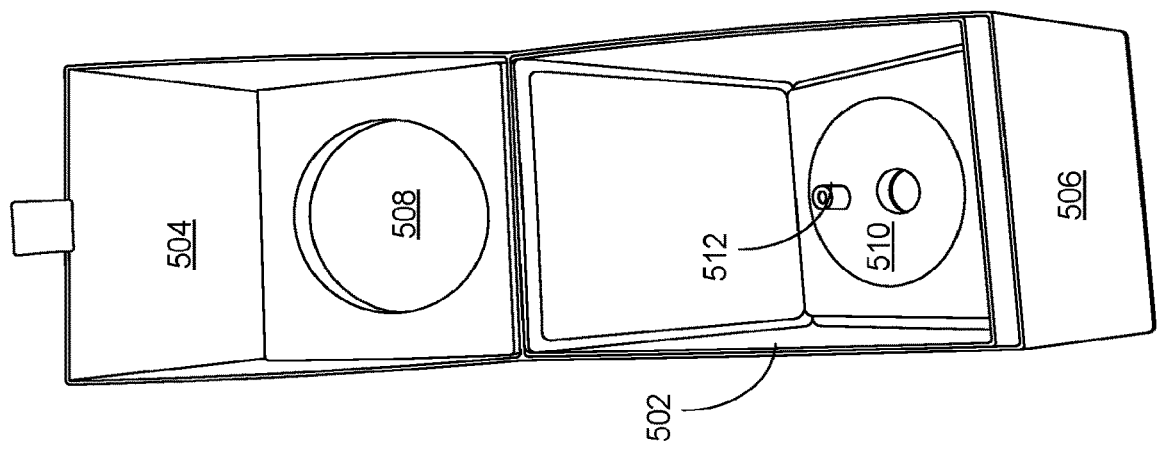
FIG. 5B is an example shipping box configured to receive a voice-activated electronic device in accordance with some implementations.
Figure 5A:
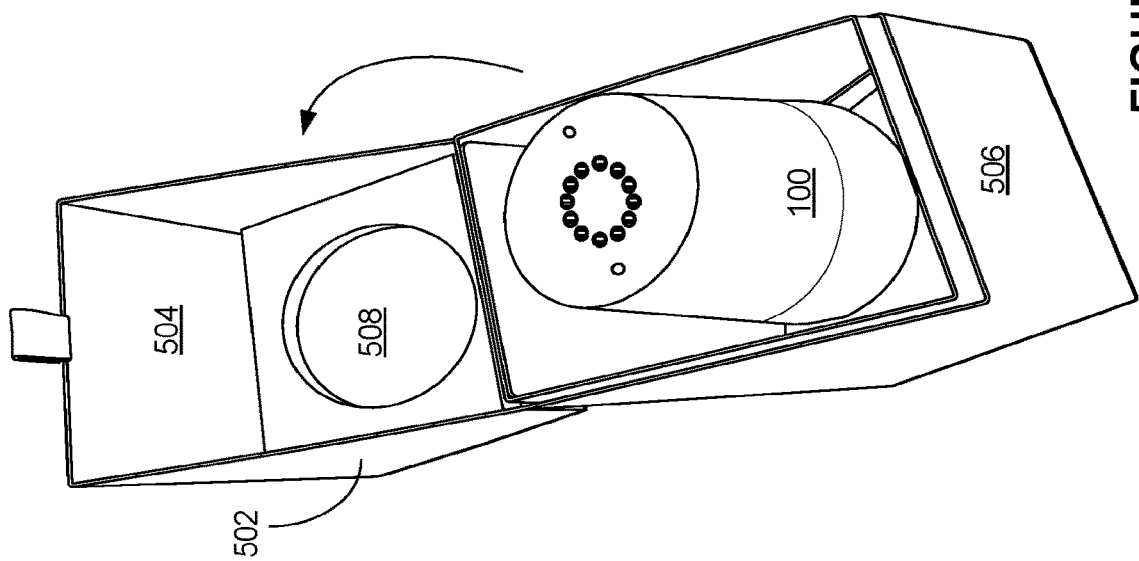
FIG. 5A is a perspective view of a voice-activated electronic device that are packaged in a shipping box in accordance with some implementations.

FIG. 5A shows a perspective view of a voice-activated electronic device 100 that is packaged in a shipping box 502 in accordance with some implementations, and FIG. 5B is an example shipping box 502 configured to receive a voice-activated electronic device 100 in accordance with some implementations. The shipping box 502 includes a cover portion 504 and a holding portion 506. The cover portion 504 is configured to open with respect to the holding portion 506. An interior bottom surface of the holding portion 506 includes a first recess 510 and a protruded structure 512. The top portion 120 and the base portion 110 of the electronic device 100 are joined, when the electronic device is placed within the shipping box 502. The base portion 110 of the electronic device 100 is situated and secured within the first recess 510. In some implementations, when situated within the first recess 510, the electronic device 100 is oriented such that the protruded structure 512 is plugged into the power supply port 204 of the electronic device 100, thereby providing additional holding force to secure the electronic device 100 within the shipping box 100. Further, in some implementations, the cover portion 504 of the shipping box 502 further includes a second recess 508 configured to match the geometry of a top surface of the top portion 120 of the electronic device 110. When the cover portion 504 is flipped to cover the holding portion 506, the second recess 508 comes into contact with the top surface of the top portion 120 of the electronic device 110, thereby providing additional holding force to secure the electronic device 100 within the shipping box 100.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is to be appreciated that "smart media environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is also to be appreciated that while the terms user, customer, installer, homeowner, occupant, guest, tenant, landlord, repair person, and the like may be used to refer to the person or persons acting in the context of some particularly situations described herein, these references do not limit the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the implementations, such identity should not be construed in the descriptions that follow as necessarily limiting the scope of the present teachings to those particular individuals having those particular identities.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An electronic device, comprising:
an exterior including an upper portion and a base portion, the upper portion having a top surface and a first periphery, the base portion having a bottom surface and a second periphery, each of the top surface, first periphery cross-section, bottom surface and second periphery cross-section being substantially circular, the second periphery of the base portion including an acoustically transparent wall and being covered by a first surface material that is different from a second surface material of the upper portion;
two or more speakers that are concealed within the exterior and face at least two distinct directions, each speaker being attached to and extending below the upper portion, wherein the two or more speakers face towards the acoustically transparent wall of the base portion;
one or more microphones configured to receive audio inputs;
one or more display LEDs mounted in the upper portion;
one or more processors electrically coupled to the microphone, the one or speakers, and the one or more display LEDs; and
a power supply connector disposed at the base portion and configured to couple to an external power supply to power the electronic device.

2. The electronic device of claim 1, wherein the upper portion and the base portion are separable and moveable between a joined position and a separated position, and when the upper portion and the base portion are in the joined position, a first external surface of the upper portion and a second external surface of the base portion form an overall exterior of the electronic device.

3. The electronic device of claim 2, wherein the base portion has a circular opening, and the upper and base portions are configured to be moved from the separated position to the joined position by movement of the one or more speakers through the circular opening of the base portion.

4. The electronic device of claim 3, wherein the base portion further includes a first opening that is distinct from the circular opening of the base portion, and the first opening in the base portion is located at a bottom side of the base portion and configured to expose a bottom side of the upper portion when the upper portion and the base portion are in the joined position.

5. The electronic device of claim 4, wherein the first opening of the base portion is circular and is annular with the circular opening of the base portion.

6. The electronic device of claim 1, wherein the acoustically transparent wall of the base portion includes a porous wall configured to let the sound provided by the one or more speakers to go out of the electronic device.

7. The electronic device of claim 1, wherein the upper portion and the base portion are configured to be joined securely and separated through manual human manipulation of one or both of the upper portion and the base portion to move the upper and base portions between the separated and joined positions.

8. The electronic device of claim 1, further comprising electronic components coupled to the upper portion and contained at least in part within the base portion, wherein:
the electronic components include a first electrical connector configured to supply power and/or data to the electronic components and/or to output data signals from the electronic components when the first electrical connector is connected to an external power and/or data connector;
the first electrical connector includes a plurality of first electrical contacts configured in a pattern that is substantially co-planar with a base surface of the electronic components; and
the first electrical contacts of the first electrical connector are configured to couple electrically with corresponding second electrical contacts of the external power and/or data connector provided at a second surface external to the electronic device.

9. The electronic device of claim 8, wherein the first electrical connector is configured to provide a hard wired network connection to the electronic components to allow for high speed network operation.

10. The electronic device of claim 8, wherein the first electrical connector is configured to output digital signals that are provided by one or more software applications executed by the electronic components, wherein convey one or more of video information, audio information, user interaction information, including audible instructions, control data, and location information.

11. The electronic device of claim 8, wherein when the second surface is provided at one of a gaming system, an audio system, and a digital media player system, the electronic components are configured to output via the first electrical connector user gaming inputs conveyed by a user via capabilities of the electronic components.

12. The electronic device of claim 8, wherein when the second surface is provided at a mobile electronic system, the electronic components are configured to output control information to control movement of the mobile electronic system conveyed by capabilities of the electronic components, the capabilities reflecting one or more of user commands and outputs of applications executed by the electronic components.

13. The electronic device of claim 8, wherein the first electrical contacts are substantially flat and the base portion is substantially flat, thereby enabling the electronic device to connect to the corresponding second electrical contacts of a substantially flat external power and/or data connector.

14. The electronic device of claim 1, wherein:
the upper portion includes a first internal surface having a first attachment structure and a first external surface that extends beyond the first internal surface in a direction opposite the first attachment structure;
the base portion includes a second internal surface having a second attachment structure and a circular opening and a second external surface; and
the first and second internal surfaces have compatible shapes, and when the upper and base portions are in a joined position the first and second internal surfaces form a nested arrangement that allows for interaction between the first and second attachment structures and the upper portion abuts the base portion.

15. The electronic device of claim 14, wherein the first and second attachment structures are configured to form a secure but separable connection to one another via magnetic attraction when the first and second portions are joined.

16. The electronic device of claim 15, wherein the magnetic attraction between the first and second attachment structures is strongest when the first and second attachment structures are in a first preferred orientation with respect to one another, wherein the first preferred orientation is a subset of possible orientations of the first and second attachment structures with respect to one another.

17. The electronic device of claim 1, wherein at least a portion of a side surface of the exterior is tapered.

18. The electronic device of claim 1, wherein the one or more display LEDs are configured to indicate status of voice processing associated with an audible user request captured by the one or more microphones.

\* \* \* \* \*